United States Patent
Chou (10) Patent No.: US 7,532,028 B2
(45) Date of Patent: May 12, 2009

(54) IMPEDANCE MATCHING CIRCUIT AND RELATED METHOD THEREOF

(75) Inventor: Yu-Pin Chou, Miao-Li Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/863,286

(22) Filed: Sep. 28, 2007

(65) Prior Publication Data
US 2008/0079511 A1 Apr. 3, 2008

(30) Foreign Application Priority Data
Sep. 29, 2006 (TW) ............................... 95136191 A (51) Int. Cl.
*H03K 17/16* (2006.01)
(52) U.S. Cl. ........................ 326/30; 333/17.3
(58) Field of Classification Search ................ 326/30, 326/26, 27, 38, 41, 86, 87; 333/17.3, 32; 327/108, 109; 365/189.05, 189.11, 202, 365/233.1
See application file for complete search history.

(56) References Cited

U.S. PATENT DOCUMENTS 5,666,078 A * 9/1997 Lamphier et al. ........... 327/108
6,911,875 B2 6/2005 Lee
7,170,364 B2 1/2007 Lee
2002/0145443 A1 * 10/2002 Partow et al. ................. 326/30
2002/0172066 A1 * 11/2002 Mughal et al. ................ 365/63
2003/0102932 A1 * 6/2003 Lee et al. .................... 333/17.3
2003/0107449 A1 * 6/2003 Gonzalez et al. ........... 333/17.3
2004/0066211 A1 * 4/2004 Herz ............................ 326/30
2005/0184922 A1 * 8/2005 Ida et al. ..................... 343/861

FOREIGN PATENT DOCUMENTS

TW 538602 6/2003

* cited by examiner

*Primary Examiner*—Rexford Barnie
*Assistant Examiner*—Jany Tran
(74) *Attorney, Agent, or Firm*—Winston Hsu (57) ABSTRACT

The invention relates to an impedance matching circuit including: an input terminal for receiving an input signal; a variable impedance unit, coupled to the input terminal, having an equivalent impedance for providing the input terminal with an input impedance; a signal quality evaluating unit, coupled to the input terminal, for evaluating a signal quality of the input signal; and a control unit coupled to the variable impedance unit and the signal quality evaluating unit, for outputting a target control signal according to an evaluating result of the signal quality evaluating unit to adjust the equivalent impedance of the variable impedance unit.

18 Claims, 7 Drawing Sheets

IMPEDANCE MATCHING CIRCUIT AND RELATED METHOD THEREOF

BACKGROUND OF THE INVENTION

1. Field of the Invention

The invention relates to an impedance matching circuit, and more particularly, to an impedance matching circuit without external resistor and capable of automatically adjusting the impedance.

2. Description of the Prior Art

Impedance matching is one of the major considerations of high-speed data transmission. Once the impedance value of an input terminal more closes to a transmission medium, the reflection power will be reduced, and thus the input terminal can obtain a better signal quality. In general, impedance matching techniques are applied in transmission interfaces of analog signals such as LCD display controllers, network controller chips, etc. When the impedance value of the transmission medium is 50 ohms or 75 ohms, the input terminal will adjust the impedance value as close as possible to 50 ohms or 75 ohms respectively.

In general, the concept of the impedance matching circuit is to add a precision resistor outside an IC for adjusting the equivalent impedance inside the IC to become close to the impedance value of the precision resistor. Since the impedance value of the external precision resistor is equal to the equivalent impedance of the transmission medium, the impedance matching purpose can be attained at the input terminal. A disadvantage of this conventional method, however, is that at least a pin is required to be connected to the precision resistor, and therefore package volume and fabrication cost of the IC will be increased.

SUMMARY OF THE INVENTION

It is therefore one of the objectives of the present invention to provide an automatically impedance matching circuit that further save the IC pin count.

According to an embodiment of the present invention, an impedance matching circuit is disclosed. The impedance matching circuit includes: an input terminal, for receiving an input signal, a variable impedance unit, coupled to the input terminal, having an equivalent impedance for providing the input terminal with an input impedance, a signal quality evaluating unit, coupled to the input terminal, for evaluating a signal quality of the input signal, and a control unit, coupled to the variable impedance unit and the signal quality evaluating unit, for outputting a target control signal according to an evaluating result of the signal quality evaluating unit for adjusting the equivalent impedance of the variable impedance unit.

According to an embodiment of the present invention, an impedance matching method is disclosed. The impedance matching method includes: using a variable impedance unit to provide an input terminal with an input impedance, evaluating a signal quality of an input signal received by the input terminal; and generating a control signal according to an evaluating result of the signal quality evaluation to adjust an equivalent impedance of the variable impedance unit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
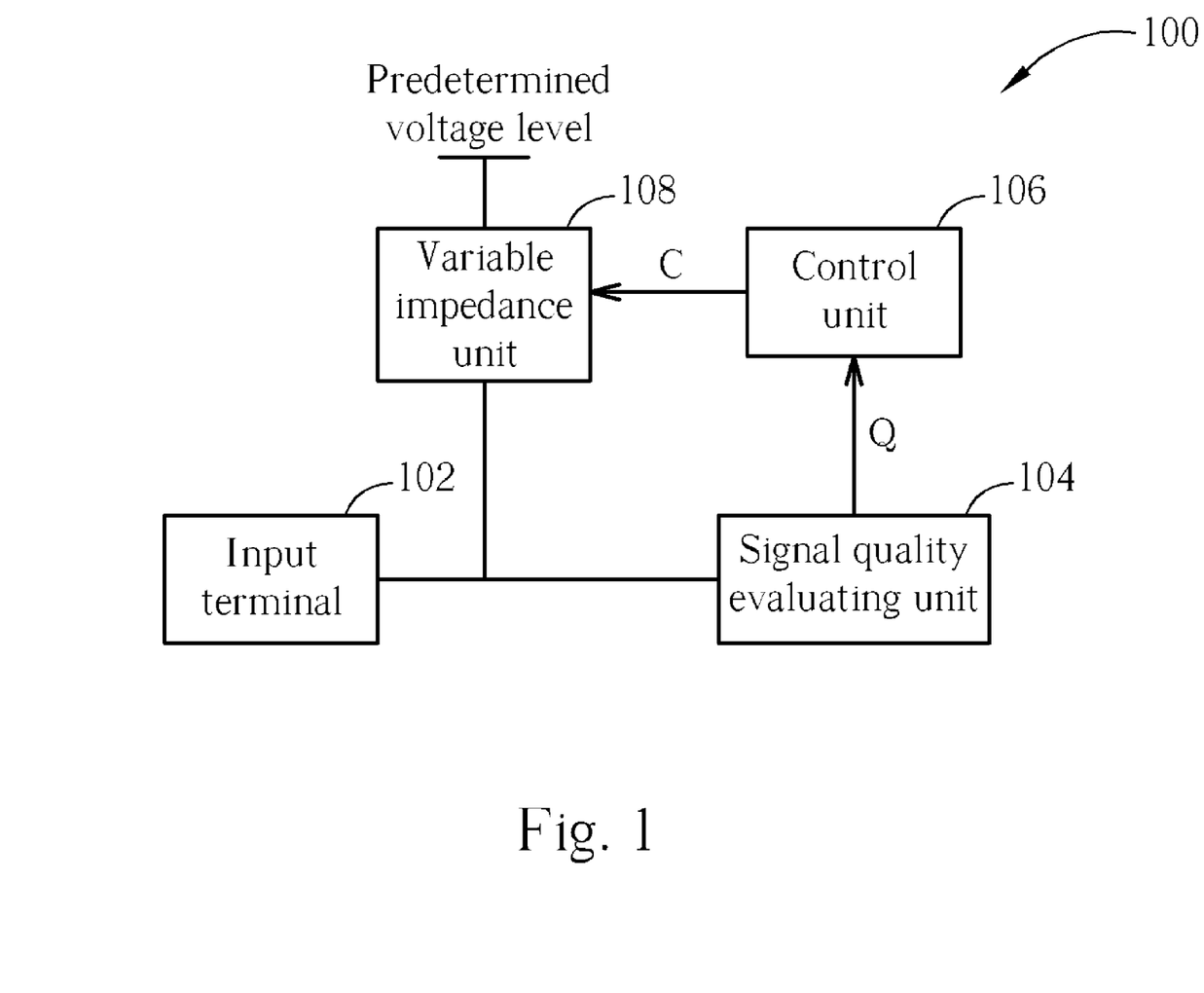
FIG. 1 is a block diagram of an impedance matching circuit according to a first embodiment of the present invention.

Please refer to FIG. 1. FIG. 1 is a block diagram of an impedance matching circuit 100 according to a first embodiment of the present invention. As shown in FIG. 1, the impedance matching circuit 100 includes an input terminal 102, a signal quality evaluating unit 104, a control unit 106, and a variable impedance unit 108. The input terminal 102 is utilized for receiving an input signal outside a chip. In general, the input signal is an analog signal. The variable impedance unit 108 has a terminal coupled to a predetermined potential and another terminal coupled to the input terminal 102 to provide the input terminal 102 with an input impedance. The signal quality evaluating unit 104 is utilized for evaluating a signal quality of the input signal, and the control unit 106 outputs a target control signal according to an evaluating result of the signal quality evaluating unit 104 for adjusting the equivalent impedance of the variable impedance unit 108 in order to meet the purpose of impedance matching. The input terminal 102, the signal quality evaluating unit 104, the control unit 106, and the variable impedance unit 108 of the impedance matching circuit 100 in the present invention are all positioned in the same chip.

Figure 2:
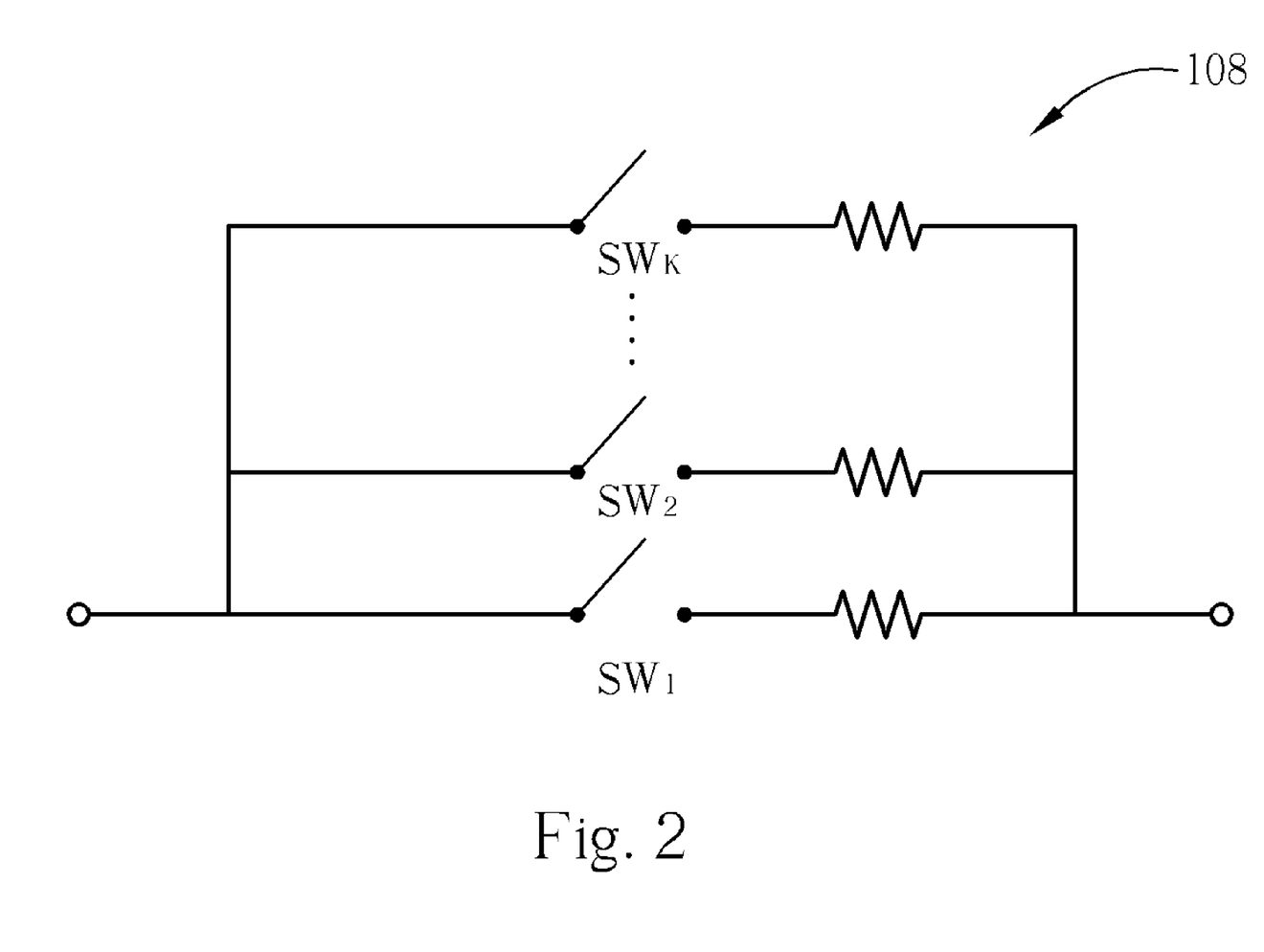
FIG. 2 is a block diagram of an embodiment of the variable impedance unit shown in FIG. 1.

Please refer to FIG. 2. FIG. 2 is a block diagram of an embodiment of the variable impedance unit 108 shown in FIG. 1. As shown in FIG. 2, the variable impedance unit 108 includes k switches and k resistors. When the different switches are turned off, the equivalent impedance of the variable impedance unit 108 will also change. Please note that the configuration of the variable impedance unit 108 is well known to a person of average skill in the pertinent art, and therefore the present invention is not limited to the above embodiment. Furthermore, the resistors of the variable impedance unit 108 can also be replaced by active components such as MOS transistors or BJT transistors, and therefore the present invention is not limited to the above resistors (passive components).

Figure 4:
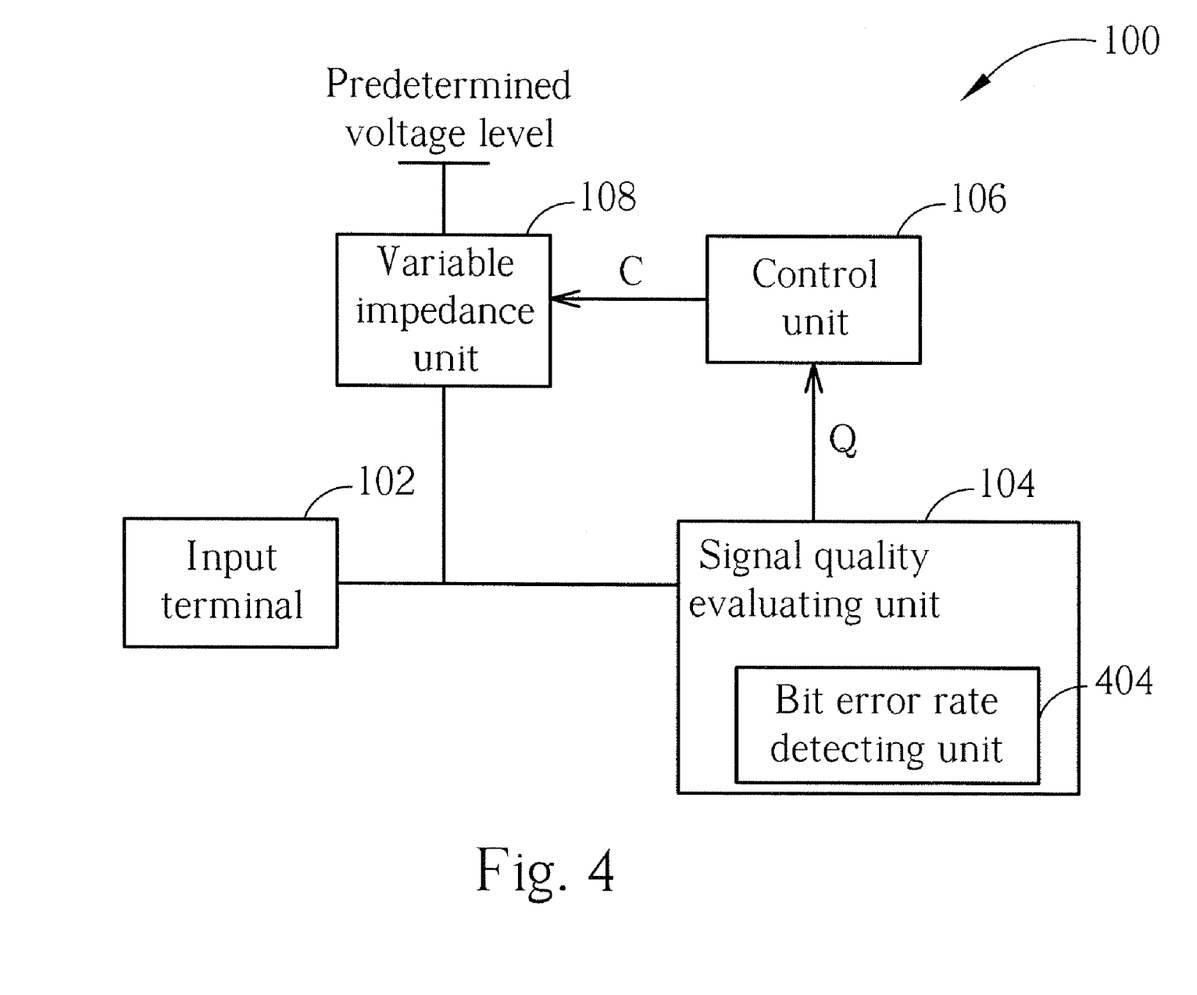
FIG. 4 is a block diagram of an impedance matching circuit according to a first exemplary variation of the first embodiment shown in FIG. 1.
Figure 5:
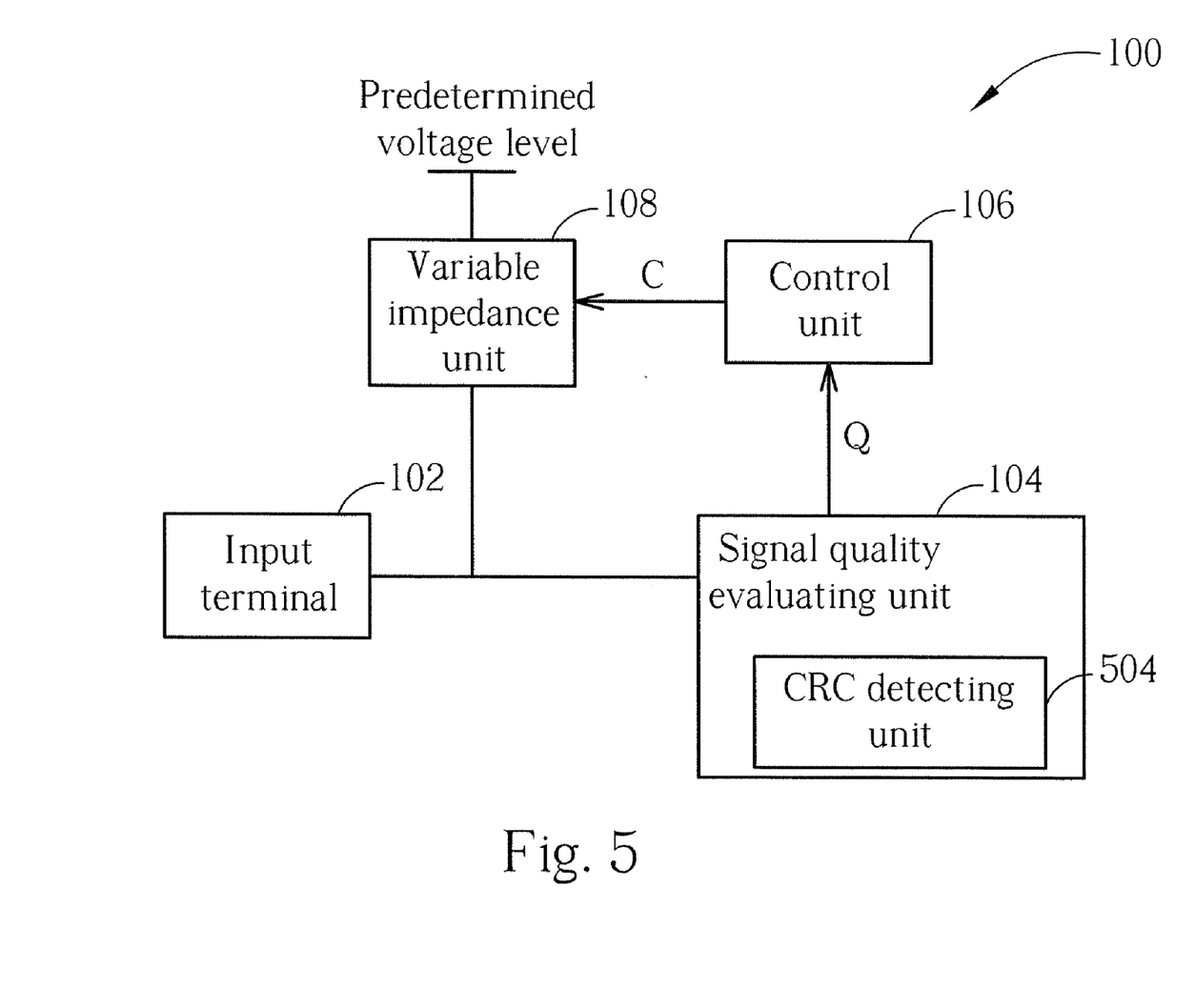
FIG. 5 is a block diagram of an impedance matching circuit according to a second exemplary variation of the first embodiment shown in FIG. 1.
Figure 6:
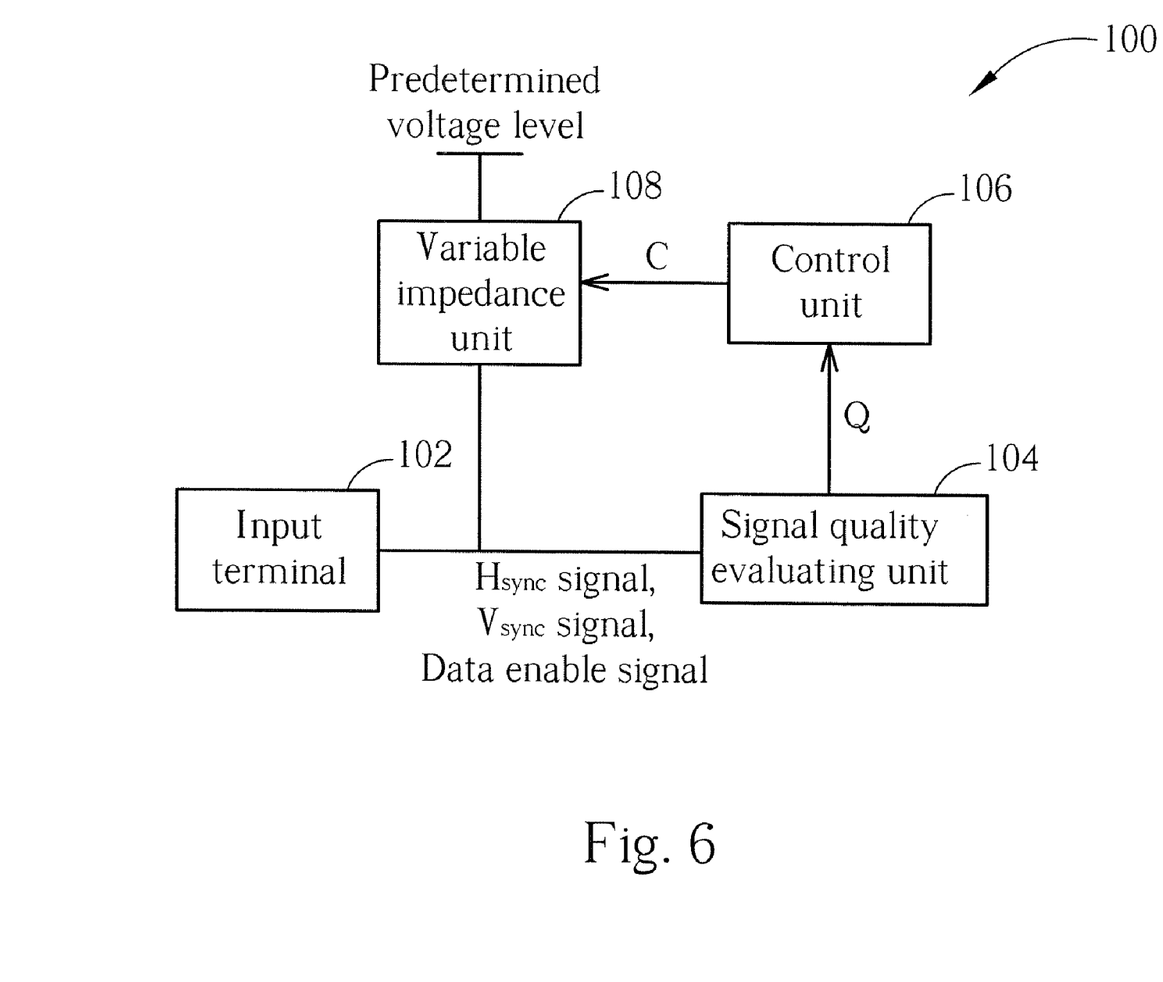
FIG. 6 is a block diagram of an impedance matching circuit according to a third exemplary variation of the first embodiment shown in FIG. 1.
Figure 7:
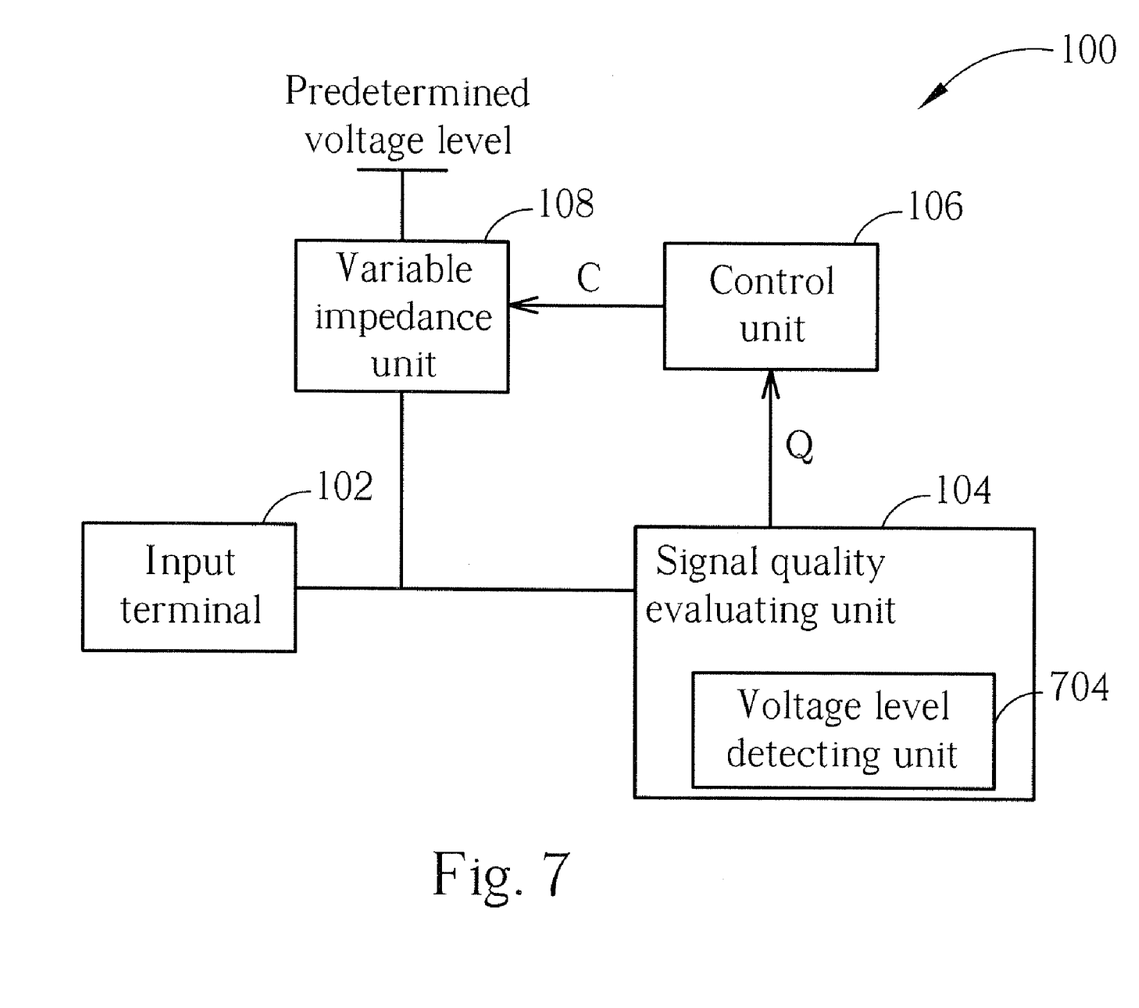
FIG. 7 is a block diagram of an impedance matching circuit according to a fourth exemplary variation of the first embodiment shown in FIG. 1.

Please return to FIG. 1. When performing the impedance matching process, the control unit 106 will sequentially send N candidate control signals $C_1, \ldots, C_N$ to the variable impedance unit 108 in order to sequentially switch the equivalent impedance of the variable impedance unit 108 to N kinds of different impedance values $R_1, \ldots, R_N$. Next, the signal quality evaluating unit 104 evaluates a signal quality of the input signal when the input terminal 102 corresponds to different input impedance. According to whether the impedance matches will affect the signal quality of the input signal, the signal quality evaluating unit 104 will respectively generate a plurality of signal quality values $Q_1, \ldots, Q_N$ corresponding to the candidate impedance values $R_1, \ldots, R_N$. Please note that the evaluating mechanisms of the signal quality evaluating unit 104 in the present invention has many varieties. In an embodiment as shown in FIG. 4, a bit error rate detecting unit 404 in the signal quality evaluating unit 104 can be utilized for detecting a bit error rate of the input signal as the signal quality value Q. In another embodiment as shown in FIG. 5, in the signal quality evaluating unit 104, a cyclic redundancy check (CRC) detecting unit 504 can be utilized to generate the signal quality value Q according to the CRC detection result for the input signal. When the input signal is an image signal, the signal quality evaluating unit 104 can generate the signal quality value Q according to the variation of a horizontal synchronization (Hsync) signal, a vertical synchronization (Vsync) signal, and a data enable signal, as shown in FIG. 6. In addition, as shown in FIG. 7, a voltage level detecting unit 704 in the signal quality evaluating unit 104 can be utilized for detecting a voltage level of the input signal to evaluate the signal quality value Q of the input signal. After the signal quality values $Q_1, \ldots, Q_N$ (corresponding to each candidate impedance values $R_1, \ldots, R_N$) are all generated, the control unit 106 will select a candidate control signal $C_m$ corresponding to an optimal signal quality value $Q_m$ as a target control signal. For example, if the signal quality value Q corresponds to a bit error rate, the control unit 106 will select a signal quality value $Q_m$ having the minimum value and send a candidate control signal $C_m$, corresponding to the signal quality value $Q_m$ as a target control signal to the variable impedance unit 108. In this way, the input signal can be ensured to have a better signal quality. According to another embodiment of the present invention, however, the control unit 106 also can select a candidate control signal $C_m$ corresponding to a signal quality value $Q_m$ having a value smaller than a predetermined threshold as a target control signal, and the control unit 106 is not limited to select the minimum signal quality value.

Additionally, when an IC device that utilizes the present invention has a plurality of input terminals, an impedance matching circuit 100 can be implemented at each input terminal. If each input terminal is in a similar environment, then the signal qualities of the input signals in each path can be assumed to be similar. Thus, only a signal quality evaluating unit 104 and a control unit 106 are required. A variable impedance unit 108 can be connected in parallel at each input terminal, and the same control signal can be utilized to control the variable impedance unit 108 to maintain the quality of each input signal.

Figure 3:
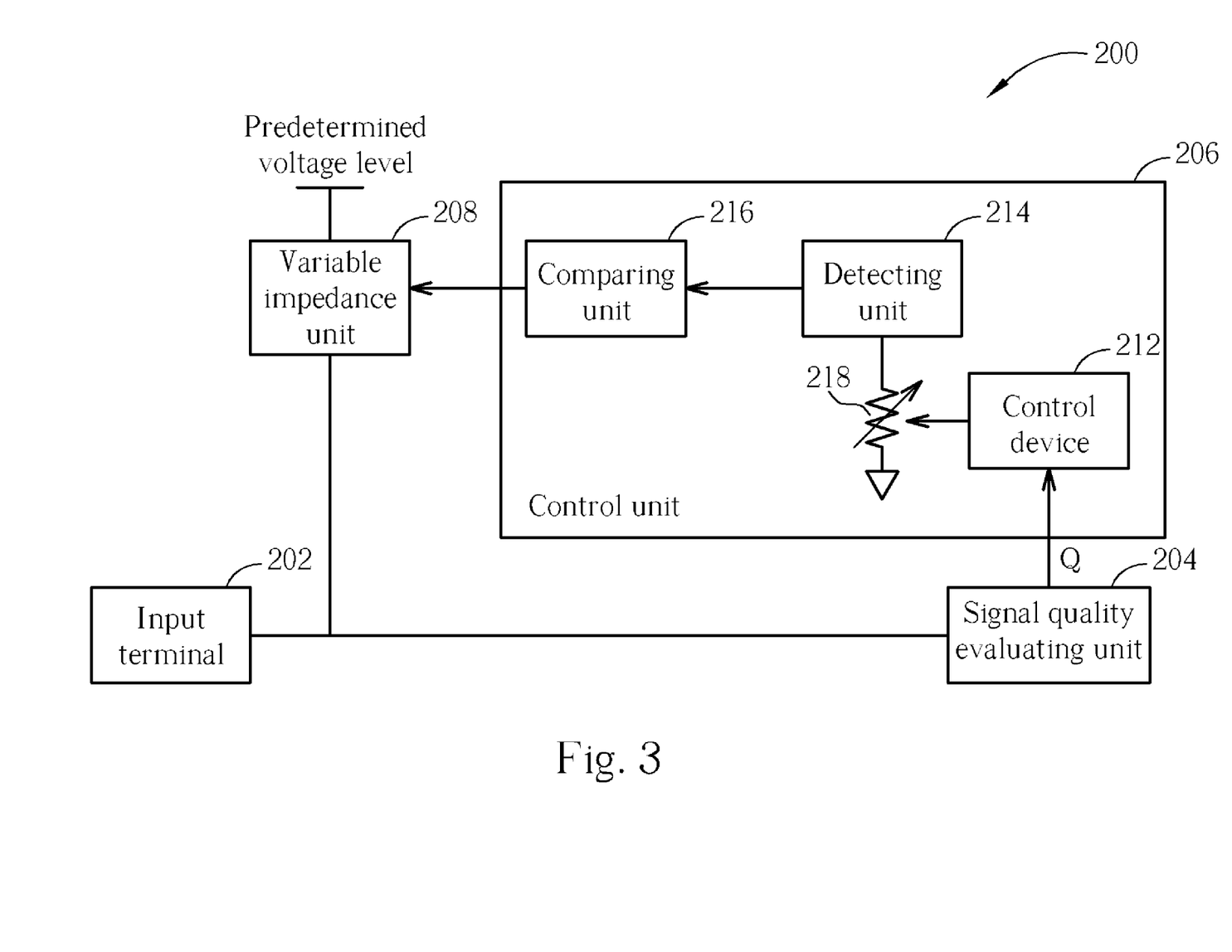
FIG. 3 is a block diagram of an impedance matching circuit according to a second embodiment of the present invention.

Please refer to FIG. 3. FIG. 3 is a block diagram of an impedance matching circuit 200 according to a second embodiment of the present invention. As shown in FIG. 3, the impedance matching circuit 200 includes an input terminal 202, a signal quality evaluating unit 204, a control unit 206, and a variable impedance unit 208. The major difference between the second embodiment and FIG. 1 is that the control unit 206 includes a control device 212, a detecting unit 214, a comparing unit 216, and a variable impedance device 218. Since the configurations and operations of the signal quality evaluating unit 204 and the variable impedance unit 208 are the same as the components of the same name in FIG. 1, additional details are omitted here for the sake of brevity.

Furthermore, U.S. Pat. No. 6,911,875 "Impedance matching circuit with automatic adjustment and method thereof" can be referred to for further information on the operations and configurations of the detecting unit 214, the comparing unit 216, and the variable impedance device 218. Where the detecting unit 214 can be referred to the transistor Ta, Tb, T0~Tm and operational amplifier 211 in the U.S. Pat. No. 6,911,875, which comprises the function of generating a potential at one end of the variable impedance device 218 so as to detect a current on the variable impedance device 218 and finally outputting a plurality of reference voltages according to the current on the variable impedance device 218; the comparing unit 216 can be referred to the comparison unit 22 and variable impedance device 218 can be referred to the reference resistor Rb in the U.S. Pat. No. 6,911,875 but replace the reference resistor Rb to a variable resistor and put the reference resistor Rb in a chip. As the structure shown in FIG. 3, when the control device 212 sends N candidate control signals $C_1, \ldots, C_N$ to the variable impedance device 218, the variable impedance device 218 will generate different impedance values, and the detecting unit 214 and the comparing unit 216 enable the variable impedance unit 208 to change its equivalent impedance to be the same as the impedance value of the variable impedance device 218. Finally, the control device 212 will select a minimum value $Q_m$ from the quality values $Q_1, \ldots, Q_N$ corresponding to a plurality of impedance values, and send the corresponding candidate control signal $C_m$ to the variable impedance unit 208 in order to set the equivalent impedance of the variable impedance unit 208 to complete the impedance matching process.

Those skilled in the art will readily observe that numerous modifications and alterations of the device and method may be made while retaining the teachings of the invention.

What is claimed is:

1. An impedance matching circuit, comprising:
   an input terminal, for receiving an input signal;
   a variable impedance unit, coupled to the input terminal, having an equivalent impedance for providing an input impedance at the input terminal;
   a signal quality evaluating unit, coupled to the input terminal, for evaluating a signal quality of the input signal; and
   a control unit coupled to the variable impedance unit and the signal quality evaluating unit, for outputting a control signal according to an evaluating result of the signal quality evaluating unit to adjust the equivalent impedance of the variable impedance unit, wherein the control unit comprises:
      a variable impedance device, having a first terminal and a second terminal, the first terminal coupled to a first predetermined potential;
      a control device, coupled to the signal quality evaluating unit and the variable impedance device, for selling an impedance value of the variable impedance device according to the evaluating result;
      a detecting unit, coupled to the second terminal, for providing the second terminal with a second predetermined potential to detect a current passing through the variable impedance device, and generating a plurality of reference voltages according to the current; and
      a comparing unit, coupled to the detecting unit, for comparing the reference voltages to generate a comparing result, and outputting the control signal according to the comparing result to set the equivalent impedance of the variable impedance unit.

2. The impedance matching circuit of claim 1, wherein the signal quality evaluating unit comprises:
a bit error rate detecting unit, for detecting a bit error rate of the input signal to evaluate the signal quality of the input signal.

3. The impedance matching circuit of claim 1, wherein the signal quality evaluating unit comprises:
a cyclic redundancy check (CRC) detecting unit, for executing a CRC detection upon the input signal to evaluate the signal quality of the input signal.

4. The impedance matching circuit of claim 1, wherein the signal quality evaluating unit comprises:
a voltage level detecting unit, for detecting a voltage level of the input signal to evaluate the signal quality of the input signal.

5. The impedance matching circuit of claim 1, wherein the signal quality evaluating unit evaluates the signal quality of the input signal according to variations of a horizontal synchronization (Hsync) signal, a vertical synchronization (Vsync) signal, and a data enable signal.

6. The impedance matching circuit of claim 1, wherein the control unit adjusts the equivalent impedance of the variable impedance unit by comparing the evaluating result with a threshold.

7. The impedance matching circuit of claim 1, wherein the control unit adjusts the equivalent impedance of the variable impedance unit by outputting a plurality of candidate control signals, so as to generate a plurality of candidate impedance values, the signal quality evaluating unit evaluates a plurality of signal qualities corresponding to the candidate impedance values respectively to generate a plurality of signal quality results, and the control unit further selects a signal quality result which is larger than a threshold from the signal quality results to determine the control signal.

8. The impedance matching circuit of claim 1, wherein the control device sets the variable impedance device correspondingto a plurality of candidate impedance values respectively, the signal quality evaluating unit evaluates a plurality of signal qualities corresponding to the candidate impedance values respectively to determine a plurality of signal quality results, and the control unit further selects a signal quality result which is larger than a threshold from the signal quality results to determine the control signal.

9. The impedance matching circuit of claim 1, wherein the input terminal, the variable impedance unit, the signal quality evaluating unit, and the control unit are all positioned in a single chip.

10. An impedance matching method, comprising:
utilizing a variable impedance unit to provide an input impedance at an input terminal;
evaluating a signal quality of an input signal received by the input terminal; and
generating a control signal according to an evaluating result of the signal quality evaluation to adjust an equivalent impedance of the variable impedance unit comprising:
providing a variable impedance device, the variable impedance device having a first terminal and a second terminal, the first terminal coupled to a first predetermined potential;
setting an impedance value of the variable impedance device according to the evaluating result;
detecting a current passing through the variable impedance device, and generating a plurality of reference voltages according to the current;
comparing the reference voltages to generate a comparing result; and
outputting the control signal according to the comparing result to adjust the equivalent impedance of the variable impedance unit.

11. The impedance matching method of claim 10, wherein the step of evaluating the signal quality comprises:
evaluating a bit error rate of the input signal to evaluate the signal quality of the input signal.

12. The impedance matching method of claim 10, wherein the step of evaluating the signal quality comprises:
executing a cyclic redundancy check (CRC) detection upon the input signal to evaluate the signal quality of the input signal.

13. The impedance matching method of claim 10, wherein the step of evaluating the signal quality comprises:
evaluating the signal quality of the input signal according to variations of an Hsync signal, a Vsync signal, and a data enable signal.

14. The impedance matching method of claim 10, wherein the step of evaluating the signal quality comprises:
evaluating a voltage level of the input signal to evaluate the signal quality of the input signal.

15. The impedance matching method of claim 10, further comprising:
comparing the evaluating result with a threshold to generate a comparing result; and
adjusting the equivalent impedance of the variable impedance unit according to the comparing result.

16. The impedance matching method of claim 10, further comprising:
generating a plurality of candidate control signals to adjust the equivalent impedance of the variable impedance unit so as to generate a plurality of candidate impedance values;
evaluating a plurality of signal qualities corresponding to the candidate impedance values respectively to generate a plurality of signal quality results; and
selecting a signal quality result which is larger than a threshold from the signal quality results to determine the control signal.

17. The impedance matching method of claim 10, wherein the step of generating the control signal comprises:
setting the variable impedance device to generate a plurality of candidate impedance values;
evaluating a plurality of signal qualities of the candidate impedance values respectively to determine a plurality of signal quality results; and
selecting a signal quality result which is larger than a threshold from the signal quality results to determine the control signal.

18. The impedance matching method of claim 10, being applied in a display controller.

* * * * *